(12) United States Patent
Mattmiller et al.

(10) Patent No.: US 10,901,006 B2
(45) Date of Patent: Jan. 26, 2021

(54) APPARATUS HAVING A ROGOWSKI COIL ASSEMBLY

(71) Applicant: COVIDIEN LP, Mansfield, MA (US)

(72) Inventors: Aaron G. Mattmiller, Longmont, CO (US); Dean C. Buck, Loveland, CO (US); Gary E. MacIndoe, Longmont, CO (US); Tom E. McMunigal, Mead, CO (US)

(73) Assignee: Covidien LP, Mansfield, MA (US)

( * ) Notice: Subject to any disclaimer, the term of this patent is extended or adjusted under 35 U.S.C. 154(b) by 128 days.

(21) Appl. No.: 16/143,587

(22) Filed: Sep. 27, 2018

(65) Prior Publication Data
US 2019/0101572 A1 Apr. 4, 2019

Related U.S. Application Data

(60) Provisional application No. 62/565,744, filed on Sep. 29, 2017.

(51) Int. Cl.
*G01R 15/18* (2006.01)
*G01R 19/00* (2006.01)

(52) U.S. Cl.
CPC ........ *G01R 15/181* (2013.01); *G01R 19/0092* (2013.01)

(58) Field of Classification Search
CPC .................... G01R 15/181; G01R 19/0092
See application file for complete search history.

(56) References Cited

U.S. PATENT DOCUMENTS

| 5,442,280 | A | * | 8/1995 | Baudart | G01K 7/36 324/117 R |
| 9,116,179 | B2 | * | 8/2015 | Gilbert | G01R 15/181 |
| 2014/0167786 | A1 | * | 6/2014 | Gutierrez | G01R 15/181 324/654 |
| 2014/0167787 | A1 | * | 6/2014 | Sanchez | G01R 21/06 324/654 |

* cited by examiner

*Primary Examiner* — Tung X Nguyen
*Assistant Examiner* — Feba Pothen
(74) *Attorney, Agent, or Firm* — Carter, DeLuca & Farrell LLP

(57) ABSTRACT

The disclosed apparatus relates to an apparatus for sensing current that includes a Rogowski coil assembly and a circuit board. The Rogowski coil assembly has a housing, a slot in the housing configured to receive a conductor through the slot, a Rogowski coil formed within the housing, and a connector. The circuit board has a substantially planar substrate, which has a slot through the substrate configured to receive the Rogowski coil assembly. A complementary connector of the circuit board is configured to receive the connector of the Rogowski coil assembly. The Rogowski coil assembly is positioned through the slot of the substrate, and the complementary connector of the circuit board couples with the connector of the Rogowski coil assembly. In various embodiments, the conductor can be a conductive trace on the substrate of the circuit board, and the Rogowski coil is configured to detect a current through the conductive trace.

19 Claims, 4 Drawing Sheets

APPARATUS HAVING A ROGOWSKI COIL ASSEMBLY

CROSS REFERENCE TO RELATED APPLICATION

The present application claims the benefit of and priority to U.S. Provisional Application Ser. No. 62/565,744, filed on Sep. 29, 2018 the entire contents of which are incorporated herein by reference.

BACKGROUND

1. Technical Field

The present disclosure generally relates to a Rogowski coil. More particularly, the present disclosure relates to an apparatus having a Rogowski coil assembly mounted to a circuit board.

2. Background of Related Art

Rogowski coils are electrical devices that are used for measurement of electric currents and magnetic fields. Originally developed by W. Rogowski and W. Steinhousen in 1912, the Rogowski coil has a generally circular or toroidal configuration. A conductor is positioned through the circle or toroid. Current flowing through the conductor creates a magnetic field, which in turn induces voltage proportional to the time rate of change in the magnetic field in the Rogowski coil. The Rogowski coil measures the current in the conductor on the basis of performing an integration of the voltage that is induced in the Rogowski coil by the change in magnetic field. Using this integrated voltage of the Rogowski coil, the current conditions of the conductor can be measured.

Rogowski coils are useful in electronic devices because they can detect alternating current or high speed current pulses. They typically have low construction costs and are highly linear because there is generally no ferrite core. Accordingly, there is continuing interest in improving Rogowski coil assemblies and inclusion of such assemblies in electronic devices.

SUMMARY

The present disclosure relates to an apparatus having a Rogowski coil assembly and a circuit board. The Rogowski coil assembly includes a housing, a slot in the housing that is configured to receive a conductor through the slot, a Rogowski coil formed within the housing, and a connector. The circuit board has a substantially planar substrate, which has a slot through the substrate configured to receive the Rogowski coil assembly, and a complementary connector mounted on the substantially planar substrate to receive the connector of the Rogowski coil assembly. The Rogowski coil assembly is positioned through the slot of the substantially planar substrate, and the complementary connector of the circuit board couples with the connector of the Rogowski coil assembly.

In various embodiments, the Rogowski coil assembly is positioned through the slot of the substantially planar substrate at a first position where the connector of the Rogowski coil assembly is not coupled with the complementary connector of the circuit board and where no portion of the substantially planar substrate is within the slot of the Rogowski coil assembly. The Rogowski coil assembly can be placed at a second position where the complementary connector of the circuit board couples with the connector of the Rogowski coil assembly and where a portion of the substantially planar substrate is within at least a portion of the slot of the Rogowski coil assembly. The Rogowski coil assembly can be positioned in the first position in the slot of the substantially planar substrate and then laterally slid into the second position to be held by a bracket. In various embodiments, the housing of the Rogowski coil assembly includes an upper portion and a lower portion. In various embodiments, the slot of the substantially planar substrate has dimensions sized for the lower potion to pass through the slot and not for the upper portion to pass through the slot. In various embodiments, the lower portion of the housing has a semicircular periphery. In various embodiments, the upper portion of the housing has a substantially rectangular periphery.

In various embodiments, the circuit board further includes a conductive trace on the substantially planar substrate. In various embodiments, the conductive trace is orthogonal to the Rogowski coil assembly. In various embodiments, the Rogowski coil is configured to detect a current through the conductive trace to provide current measurement signals. In various embodiments, the apparatus further includes a processor in communication with the Rogowski coil assembly, where the processor processes the current measurement signals to identify a high speed current pulse.

In various embodiments, the slot of the substantially planar substrate has a substantially rectangular shape. In various embodiments, the slot configured to receive the Rogowski coil assembly has dimensions sized to receive the Rogowski coil assembly in a position orthogonal to the substantially planar substrate. In various embodiments, the Rogowski coil assembly is positioned substantially orthogonal to the substantially planar substrate of the circuit board. In various embodiments, the substantially planar substrate includes one or more substrate layers.

In various embodiments, the slot in the housing of the Rogowski coil assembly has an elongated shape with an open end at a periphery of the housing. In various embodiments, the open end of the slot in the housing of the Rogowski coil assembly is configured to receive at least a portion of the substantially planar substrate. In various embodiments, the Rogowski coil includes a coil output, where the coil output is at and end of the housing opposite the open end at the periphery of the housing.

BRIEF DESCRIPTION OF THE DRAWINGS

Various embodiments of the present disclosure are described with reference to the accompanying drawings wherein.

DETAILED DESCRIPTION

The present disclosure relates to an apparatus having a Rogowski coil assembly mounted to a circuit board. A Rogowski coil and its applications are generally understood by persons skilled in the art. Generally, Rogowski coils are used to sense current that flows through a conductor. An example of a Rogowski coil is described in U.S. Pat. No. 9,116,179, the entire contents of which are hereby incorporated by reference herein.

When used in conjunction with a circuit board, a Rogowski coil must consider various specifications applicable to circuit boards. As circuit boards must generally fit into tight spaces in a device housing, various specifications may include, for example, dimensions of the circuit board, particular locations on the circuit board reserved for particular components, and permitted height for components mounted to the circuit board, among other things. In particular, aside from the circuit board, there may be other components in the device housing such as a power supply, communication cables, or other boards, among other things, which require their own space adjacent to the circuit board. Height limitations on components mounted to the circuit board, for example, ensure that a circuit board provides sufficient space for such other components.

Figure 1:
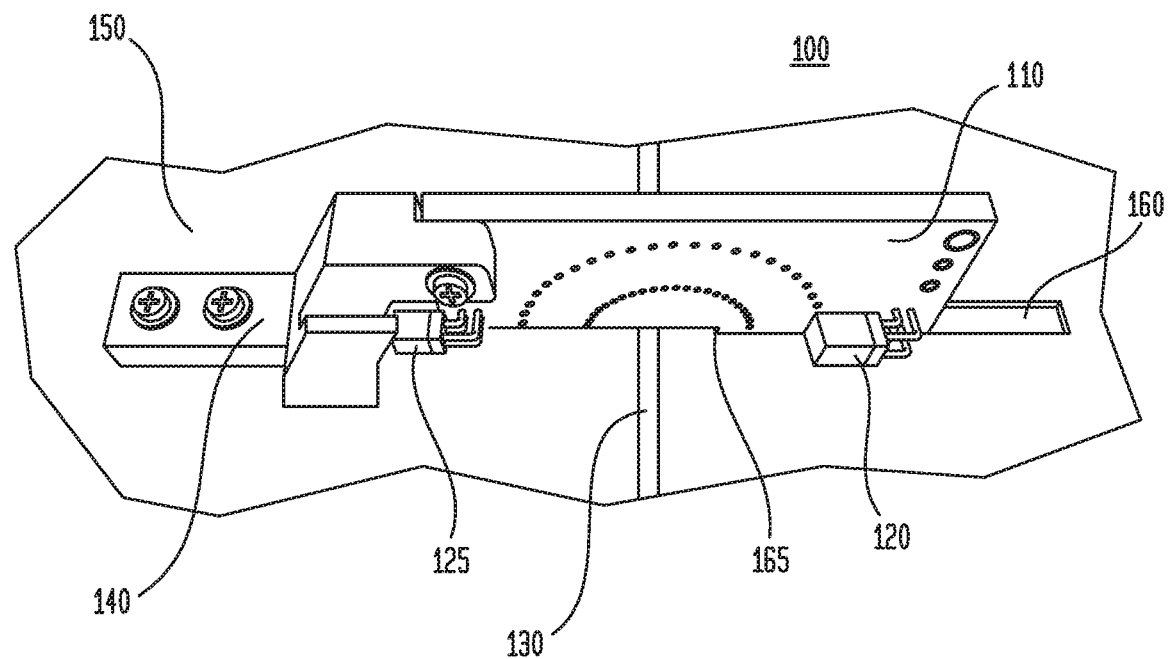
FIG. 1 is an illustration of an exemplary apparatus for sensing current in accordance with aspects of the present disclosure.

In accordance with one aspect of the present disclosure, a Rogowski coil assembly is mounted to a circuit board in such a way that the Rogowski coil may exceed typical height limitations or may intrude upon spaces in a device housing that would typically be occupied by other components. Referring to FIG. 1, there is shown an illustration of an exemplary apparatus 100 for sensing current. The illustrated apparatus 100 includes a Rogowski coil assembly 110, a circuit board substrate 150, a conductive trace 130, a bracket 140, a slot 160, and mated connectors 120, 125. The circuit board substrate 150 is substantially planar and may be a typical circuit board substrate on which conductive traces, such as trace 130, are formed and to which other components are mounted. The circuit board substrate 150 may be substantially planar but not entirely planar due to, for example, manufacturing imperfections, pressure from mounting components to the substrate, pressure from mounting the substrate, or other factors. In various embodiments, the substantially planar substrate 150 may be an entire substrate of a circuit board or may be a portion of the substrate of a circuit board.

In FIG. 1, a bracket 140 is attached to the substrate 150. The bracket 140 is made from plastic or nylon and is illustrated as being mounted to the substrate 150 using screws, but other materials for the bracket and other ways of attaching bracket 140 to the substrate 150 are contemplated. The mated connectors 120, 125 have complementary portions which include a connector attached to the Rogowski coil assembly 110 (shown in FIG. 2) and a complementary connector attached to the substrate 150 (shown in FIG. 3). The connectors may be attached to their respective components by soldering, for example, and/or by adhesives or other mechanisms.

In accordance with an aspect of the present disclosure, the substrate 150 includes a slot 160 that receives the Rogowski coil assembly 110. In the illustrated embodiment, the slot 160 is shaped to receive the Rogowski coil assembly 110 in an orientation that is orthogonal or substantially orthogonal to the substrate 150. In various embodiments, the Rogowski coil assembly 110 may be substantially orthogonal but not exactly orthogonal to the substrate 150 due to factors such as manufacturing imperfections or mounting pressure of mounting the Rogowski coil assembly 110 to the substrate 150, among other factors. The illustrated slot 160 is substantially rectangular and has a length and a depth, where the length is the longer edge of the rectangle and the depth is the shorter edge of the rectangle. In the illustrated embodiment, the depth of the slot 160 is slightly larger than the depth of the Rogowski coil assembly 110, such as larger by one or two millimeters. In various embodiments, the depth of the slot 160 can be larger than the depth of the Rogowski coil assembly 110 by another number. In various embodiments (not shown), the slot 160 can have dimensions sized to receive the Rogowski coil assembly 110 in a position that is not orthogonal to the substrate 150.

In accordance with one aspect of the present disclosure, the position of the Rogowski coil assembly 110 shown in FIG. 1 is referred to herein as an attached position. In the attached position, the Rogowski coil assembly 110 is engaged with the bracket 140. The connectors 120, 125 on the substrate 150 and on the Rogowski coil assembly 110 become mated in the attached position. The Rogowski coil assembly 110 abuts the inner edge 165 of the slot 160, and the other end of the slot 160 remains open. Additionally, the conductive trace 130 passes through the center portion of the Rogowski coil assembly 110 in the attached position, thereby allowing the Rogowski coil assembly to detect current flowing through the conductive trace 130 and provide current measurement signals. The Rogowski coil assembly 110 is able to be positioned around the conductive trace 130 due to a slot in the Rogowski coil assembly 110, which will be described in connection with FIG. 2. In various embodiments, the conductive trace 130 can be a discrete conductor such as a wire (not shown) that is soldered to the substrate 150. In various embodiments, the circuit board includes a processor (not shown) that is in communication with the Rogowski coil assembly. The processor can processor the current measurement signals from the Rogowski coil assembly 110 to identify a high speed current pulse.

Figure 2:
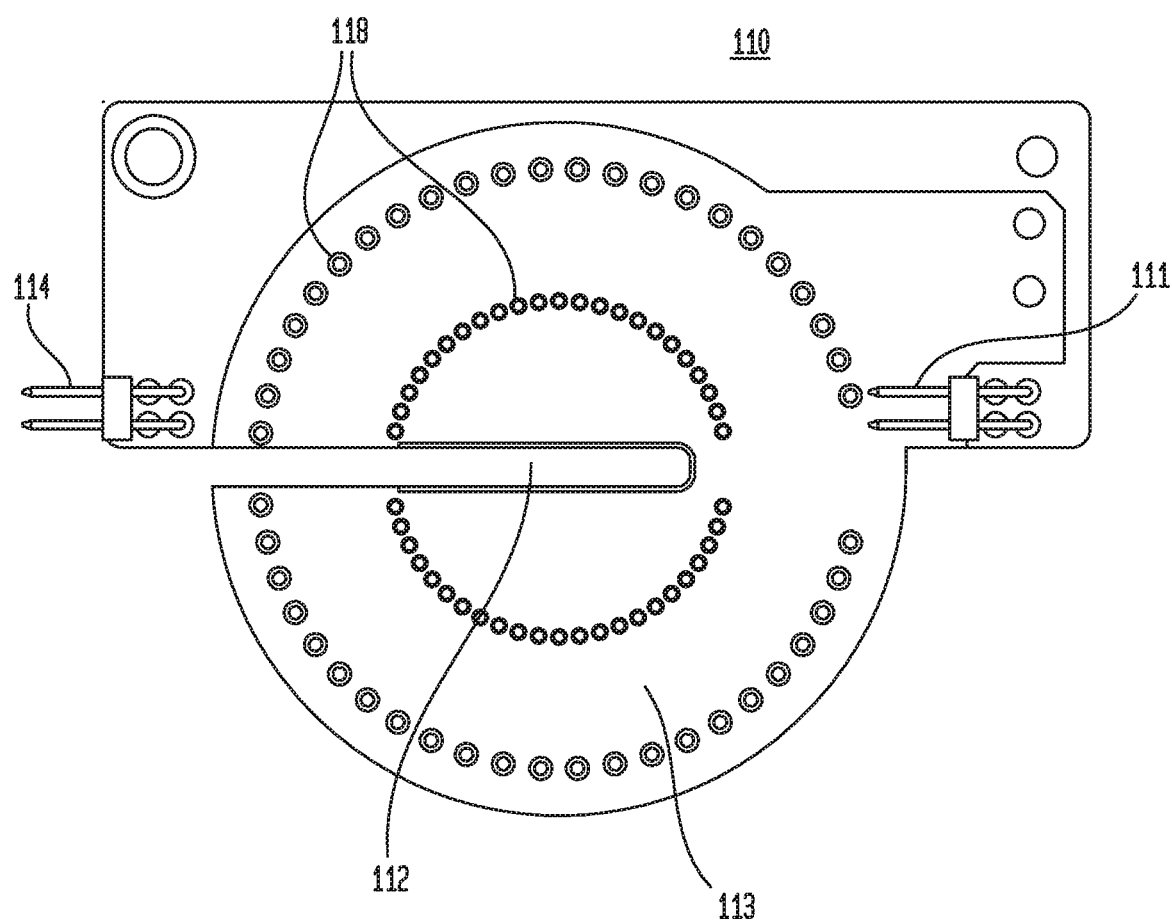
FIG. 2 is an illustration of an exemplary Rogowski coil assembly in accordance with aspects of the present disclosure.

FIG. 2 shows an illustration of the Rogowski coil assembly of FIG. 1 from a side view. The Rogowski coil assembly 110 includes a housing 113, a slot 112 in the housing 113, connectors 111,114, and a Rogowski coil 118 formed in the housing 113. In various embodiments, the housing may be an enclosure that encloses a discrete Rogowski coil 118. In various embodiments, the housing 113 may be formed by multiple board layers where each layer incorporates a part of the Rogowski coil 118 etched or formed thereon.

The connectors 111, 114 may be attached to the housing 113 by soldering, for example, and/or by adhesives or another mechanism. As mentioned above, a Rogowski coil 118 has a generally circular or toroidal configuration. A conductor (not shown) is positioned through the circle or toroid. Current flowing through the conductor creates a magnetic field, which in turn induces voltage proportional to the time rate of change in the magnetic field in the Rogowski coil 118. In the illustrated embodiment, the voltage in the Rogowski coil 118 can appear across the connectors 111, 114. When the connectors 111, 114 are coupled with the complementary connectors of the circuit board, the voltage in the Rogowski coil 118 can be communicated to the circuit board through the mated connectors (FIG. 1, 120, 125).

With reference also to FIG. 1, and in accordance with one aspect of the present disclosure, the slot 112 of the housing 113 is configured to receive the substrate 150 of the circuit board. The slot 112 can be approximately half-way between the top and bottom ends of the Rogowski coil assembly 110. In various embodiments, the slot 112 can be located at another position in the Rogowski coil assembly 110 other than half-way.

The slot 112 of the housing 113 and the conductive trace 130 of the substrate 150 are coordinated such that when the slot 112 of the housing 113 receives the substrate 150, the conductive trace 130 and the Rogowski coil assembly 110 are positioned such that the conductive trace 130 is within the center portion of the Rogowski coil 118. In various embodiments, the conductive trace 130 of the substrate 150 can be arranged to be orthogonal to the Rogowski coil assembly 110. In various embodiments, the slot 112 of the housing 113 can be an elongated slot with an open end at the periphery of the housing 113. As persons skilled in the art will recognize, a Rogowski coil includes a coil output. In various embodiments, the coil output is located at an end of the housing 113 that is opposite the open end at the periphery of the housing 113.

The particular shape of the Rogowski coil assembly 110 is exemplary. Although the top portion of the illustrated Rogowski coil assembly 110 is in the shape of a rectangle and the bottom portion is in the shape of a semicircle, and other shapes are contemplated to be within the scope of the present disclosure.

What have been described above are an embodiment of a Rogowski coil assembly 110 and an embodiment of the Rogowski coil assembly 110 and a circuit board in an attached position. What will now be described is the Rogowski coil assembly 110 and the circuit board in a non-attached position.

Figure 3:
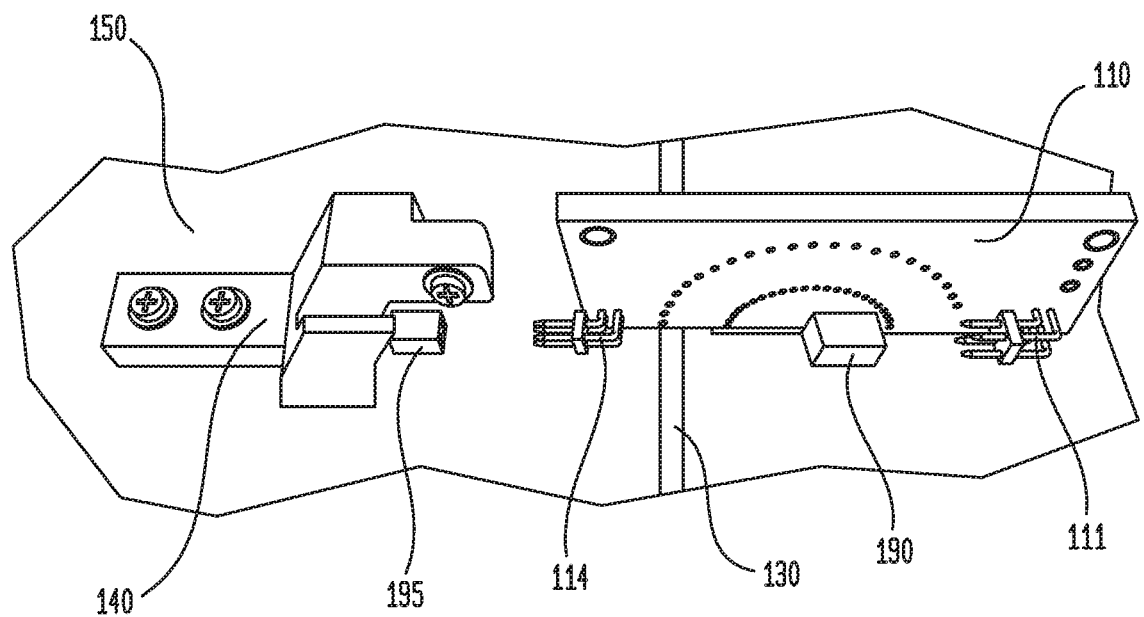
FIG. 3 shows the apparatus for sensing current of FIG. 1 in a particular assembly position.

Referring now to FIG. 3, there is shown the apparatus of FIG. 1 in a non-attached position. The apparatus of FIG. 3 includes the components shown and described in connection with FIG. 1. However, the connectors 111, 114 of the Rogowski coil assembly 110 are not yet coupled to the connectors 190, 195 of the circuit board substrate 150.

In the non-attached position, the Rogowski coil assembly 110 is inserted into the slot 160 of the substrate 150 and into the portion of the slot 160 that was open in FIG. 1. In various embodiments, the length of the slot 160 is slightly longer than the bottom, semi-circle portion of the Rogowski coil assembly 110, such as one or two millimeters longer. In various embodiments, the top, rectangular portion of the Rogowski coil assembly 110 can be too long to pass through the slot 116 and can rest on the substrate 150.

In the non-attached position, the substrate 150 of the circuit board is not yet received into the slot 112 of the Rogowski coil assembly 110. Additionally, the conductive trace 130 is not yet within the Rogowski coil 118 and is offset from the center portion of the Rogowski coil 118. From the non-attached position, the Rogowski coil assembly 110 can slide laterally along the substrate 150 toward the bracket 140. The lateral sliding causes the Rogowski coil assembly 110 to engage the bracket 140 and causes the connectors 111, 114 of the Rogowski coil assembly 110 to engage the connectors 190, 195 of the circuit board substrate 150. Additionally, the lateral sliding causes the conductive trace 130 to enter the center portion of the Rogowski coil 118. When the Rogowski coil assembly 110 is completely engaged with the bracket 140, the engagement can be secured by a screw, as illustrated, or by another device, resulting in the attached position of FIG. 1.

Figure 4:
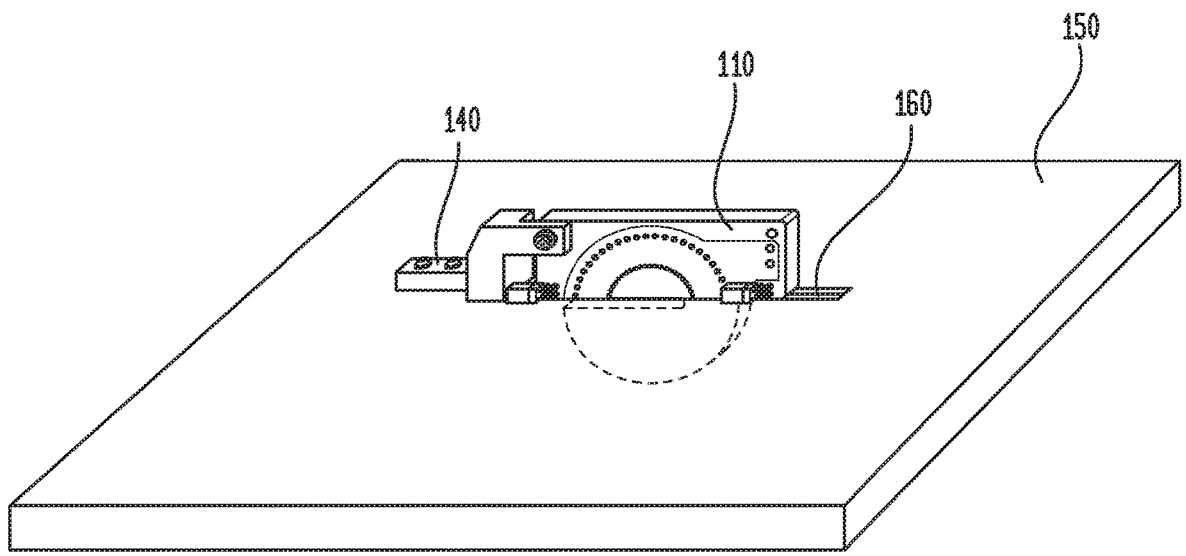
FIG. 4 shows a illustration of the apparatus of FIG. 1 with a portion above a circuit board and a portion below the circuit board.

In both the attached position of FIG. 1 and the non-attached position of FIG. 3, a portion of the Rogowski coil assembly 110 is substantially above the substrate of the circuit board and a portion of the Rogowski coil assembly 110 is substantially below the substrate of the circuit board. FIG. 4 is another illustration of the Rogowski coil assembly 110 in the attached position and secured to the bracket 140 within the slot 160. FIG. 4 illustrates the portion of the Rogowski coil assembly 110 below the circuit board substrate 150 in dotted lines. It can be seen that the Rogowski coil assembly 110 will occupy space both above and below the circuit board. The disclosed apparatus can be utilized where there is no restriction on components intruding into space below the circuit board. In various embodiments, the disclosed apparatus can be utilized even where there is such a restriction. For example, the apparatus of the present disclosure can occupy space that is designated for another component if the other component is not needed.

It has been found that, because the Rogowski coil assembly is positioned orthogonal to the circuit board substrate, the disclosed apparatus may provide reduced crosstalk between the Rogowski coil assembly and other components on the circuit board. Additionally, the orthogonal configuration of the Rogowski coil assembly has a smaller footprint, thereby permitting other components to occupy more space on the circuit board substrate. Thus, the disclosed apparatus may provide reduced crosstalk and a smaller footprint in exchange for the Rogowski assembly occupying more space above and below the circuit board or intruding into space that would otherwise be occupied by another board or device.

Accordingly, what has been described is an exemplary apparatus for sensing current. Although the illustrative embodiments of the present disclosure have been described herein with reference to the accompanying drawings, it is to be understood that the disclosure is not limited to those precise embodiments, and that various other changes and modification may be effected therein by one skilled in the art without departing from the scope or spirit of the disclosure.

What is claimed is:

1. An apparatus for sensing current comprising:
   a Rogowski coil assembly having:
     a housing;
     a slot in the housing configured to receive a conductor therethrough;
     a Rogowski coil formed within the housing; and
     a connector; and
   a circuit board having:
     a substantially planar substrate having a slot therethrough, the slot configured to receive the Rogowski coil assembly; and
     a complementary connector configured to receive the connector of the Rogowski coil assembly, the complementary connector connectively mounted on the substantially planar substrate,
   wherein the Rogowski coil assembly is positioned through the slot of the substantially planar substrate, and the Rogowski coil is movable between a first position where the connector of the Rogowski coil is uncoupled with the complementary connector of the circuit board and a second position where the complementary connector of the circuit board couples with the connector of the Rogowski coil assembly.

2. The apparatus of claim 1, wherein:
   when the Rogowski coil assembly is in the first position, no portion of the substantially planar substrate is within the slot of the Rogowski coil assembly;
   when the Rogowski coil assembly is in the second position, a portion of the substantially planar substrate is within at least a portion of the slot of the Rogowski coil assembly; and
   the Rogowski coil assembly is configured to be laterally slid from the first position to the second position to be held by a bracket.

3. The apparatus of claim 1, wherein the housing of the Rogowski coil assembly includes an upper portion and a lower portion.

4. The apparatus of claim 3, wherein the slot of the substantially planar substrate has dimensions sized for the lower portion to pass through the slot and not for the upper portion to pass through the slot.

5. The apparatus of claim 3, wherein the lower portion of the housing has a semicircular periphery.

6. The apparatus of claim 3, wherein the upper portion of the housing has a substantially rectangular periphery.

7. The apparatus of claim 1, wherein the circuit board further comprises a conductive trace on the substantially planar substrate.

8. The apparatus of claim 7, wherein the conductive trace is orthogonal to the Rogowski coil assembly.

9. The apparatus of claim 7, wherein the Rogowski coil is configured to detect a current through the conductive trace to provide current measurement signals.

10. The apparatus of claim 9, further comprising a processor in communication with the Rogowski coil assembly, wherein the processor processes the current measurement signals to identify a high speed current pulse.

11. The apparatus of claim 1, wherein the slot configured to receive the Rogowski coil assembly has dimensions sized to receive the Rogowski coil assembly in a position orthogonal to the substantially planar substrate.

12. The apparatus of claim 1, wherein the Rogowski coil assembly is positioned substantially orthogonal to the substantially planar substrate of the circuit board.

13. The apparatus of claim 1, wherein the substantially planar substrate comprises at least one substrate layer.

14. The apparatus of claim 1, wherein the slot of the substantially planar substrate has a substantially rectangular shape.

15. The apparatus of claim 1, wherein the slot in the housing of the Rogowski coil assembly has an elongated shape with an open end at a periphery of the housing.

16. The apparatus of claim 15, wherein the open end of the slot in the housing of the Rogowski coil assembly is configured to receive at least a portion of the substantially planar substrate.

17. The apparatus of claim 15, wherein the Rogowski coil includes a coil output, wherein the coil output is at an end of the housing opposite the open end at the periphery of the housing.

18. An apparatus for sensing current, comprising:
a Rogowski coil assembly having:
 a housing;
 an elongated slot defined in the housing and having an open end at a periphery of the housing;
 a Rogowski coil disposed within the housing; and
 a connector; and
a circuit board having:
 a planar substrate defining a slot therethrough, the open end of the elongated slot configured to receive at least a portion of the planar substrate; and
 a complementary connector configured to receive the connector of the Rogowski coil assembly, the complementary connector coupled to the planar substrate,
wherein the Rogowski coil assembly is positioned through the slot of the planar substrate, and the complementary connector of the circuit board is configured to couple to the connector of the Rogowski coil assembly.

19. An apparatus for sensing current, comprising:
a Rogowski coil assembly having:
 a housing defining a slot having an open end at a periphery of the housing;
 a Rogowski coil disposed within the housing; and
 a connector; and
a circuit board having:
 a planar substrate defining a slot configured to receive the Rogowski coil assembly, the open end of the slot defined in the housing configured to receive at least a portion of the planar substrate; and
 a complementary connector configured to receive the connector of the Rogowski coil assembly and to couple to the connector of the Rogowski coil assembly.

* * * * *